United States Patent
Chen et al.

(10) Patent No.: US 6,933,517 B2
(45) Date of Patent: *Aug. 23, 2005

(54) TUNNELING EMITTERS

(75) Inventors: Zhizhang Chen, Corvallis, OR (US); Paul J. Benning, Corvallis, OR (US); Sriram Ramamoorthi, Corvallis, OR (US); Thomas Novet, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 26 days.

This patent is subject to a terminal disclaimer.

(21) Appl. No.: 10/686,965

(22) Filed: Oct. 15, 2003

(65) Prior Publication Data

US 2004/0130251 A1 Jul. 8, 2004

Related U.S. Application Data

(62) Division of application No. 10/066,149, filed on Jan. 31, 2002, now Pat. No. 6,703,252.

(51) Int. Cl.[7] ............................................... H01L 29/06
(52) U.S. Cl. .......................... 257/10; 257/11; 257/163; 313/309; 313/310
(58) Field of Search ............................ 257/10–11, 163; 313/309–310

(56) References Cited

U.S. PATENT DOCUMENTS

| | | |
|---|---|---|
| 4,760,567 A | 7/1988 | Crewe |
| 4,923,421 A | 5/1990 | Brodie et al. |
| 5,086,017 A | 2/1992 | Lu |
| 5,142,184 A | 8/1992 | Kane |
| 5,374,844 A | 12/1994 | Moyer |
| 5,507,676 A | 4/1996 | Taylor et al. |
| 5,528,103 A | 6/1996 | Spindt et al. |
| 5,557,596 A | 9/1996 | Gibson et al. |
| 5,559,342 A | 9/1996 | Tsukamoto et al. |
| 5,578,900 A | 11/1996 | Peng et al. |
| 5,760,417 A | 6/1998 | Watanabe et al. |
| 6,010,918 A | 1/2000 | Marino et al. |
| 6,011,356 A | 1/2000 | Janning et al. |
| 6,023,124 A | 2/2000 | Chuman et al. |
| 6,033,924 A | 3/2000 | Pack et al. |
| 6,303,504 B1 | 10/2001 | Lin |
| 6,313,043 B1 | 11/2001 | Hattori |
| 6,781,146 B2 * | 8/2004 | Chen et al. ............... 257/10 |
| 6,806,488 B2 * | 10/2004 | Ramamoorthi et al. ....... 257/10 |
| 6,835,947 B2 * | 12/2004 | Govyadinov et al. ......... 257/10 |

FOREIGN PATENT DOCUMENTS

| | | |
|---|---|---|
| EP | 0685869 A1 | 12/1995 |
| EP | 0913849 A2 | 5/1999 |
| EP | 1308980 A2 | 5/2003 |
| JP | 02306520 | 12/1990 |
| JP | 2000331595 | 12/2000 |
| WO | WO01/80273 A1 | 10/2001 |
| WO | WO 02/35897 | 5/2002 |

* cited by examiner

*Primary Examiner*—Dung A. Le
(74) *Attorney, Agent, or Firm*—Timothy F. Myers

(57) ABSTRACT

An emitter includes an electron supply and a tunneling layer disposed on the electron supply. A cathode layer is disposed on the tunneling layer. A conductive electrode has multiple layers of conductive material. The multiple layers include a protective layer disposed on the cathode layer. The conductive electrode has been etched to define an opening thereby exposing a portion of the cathode layer.

44 Claims, 15 Drawing Sheets

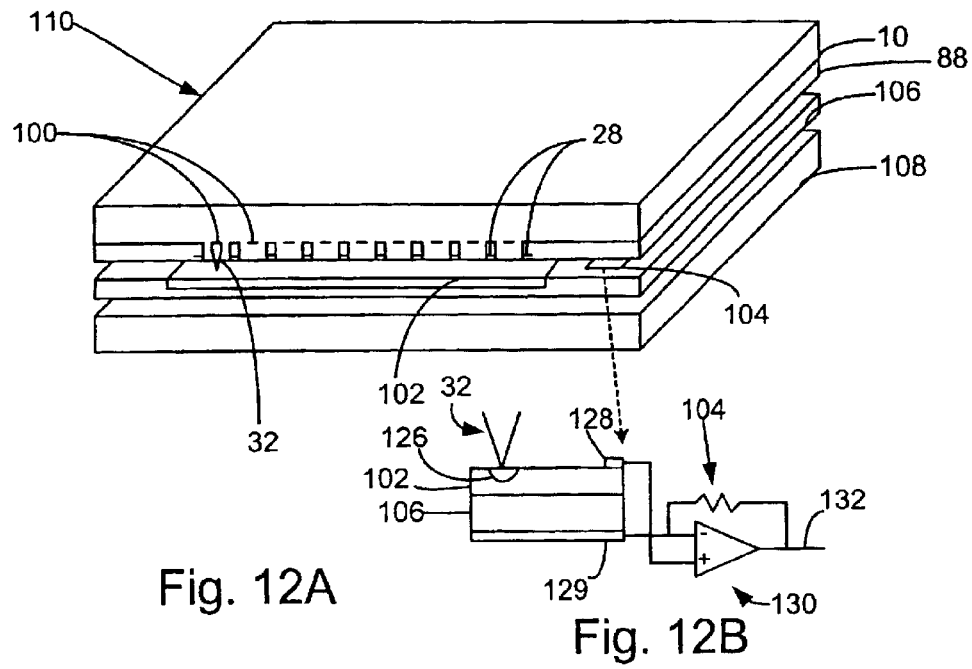
Fig. 12A
Fig. 12B
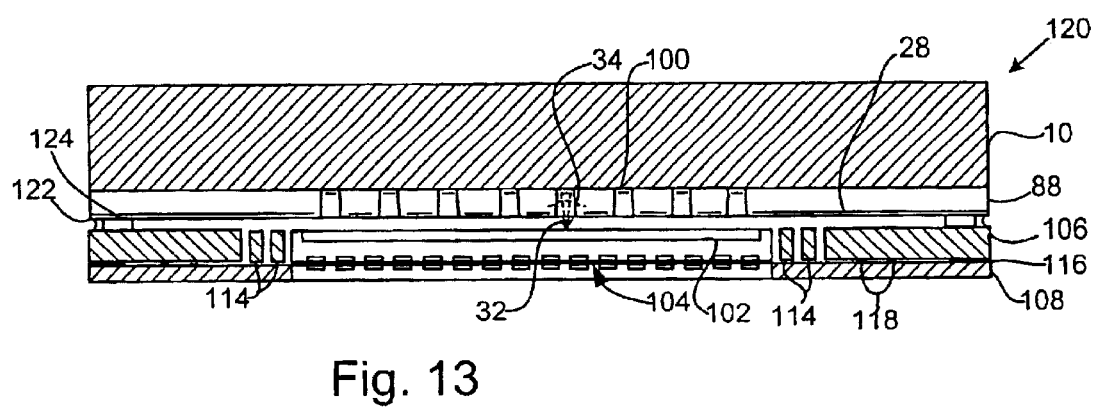
Fig. 13

TUNNELING EMITTERS

This application is a divisional of application Ser. No. 10/066,149, filed Jan. 31, 2002, now U.S. Pat. No. 6,703,252.

BACKGROUND OF THE INVENTION

Computing technology continues it long term trend of becoming less expensive while providing more capability in terms of spend, storage density, and display pixel density. However, this trend may not continue. To allow computing technology to continue to provide more capability, peripheral devices such as mass storage devices and display devices must continue to advance. Hard disk drives, for example, have been able to increase the storage density tremendously over the last decade but are now encountering physical limitations that prevent further progress in density. Moreover, criticism has been voiced in the trade press about the inability of manufacturers of mass storage devices (such as disk drives, CD-ROMs, and DVD drives) to increase the data rate inline with the advancing speed of the microprocessors thereby limiting the system performance of such electronic devices as personal computers. In addition, although some hard disk drives have been miniaturized to operate with portable devices, their high power requirements still limit long-term battery operation. A storage device is needed that has a higher data rate, is more energy efficient, and higher-density than conventional devices.

In addition, users continue to insist on higher density display devices such as LCD panels and cathode ray tubes. Increasing the pixel resolution requires faster data rates to the display device because the display must be refreshed at the same rate as previous low density displays in order to prevent unwanted display flicker. Moreover, display devices, such as LCD monitors have had difficulty in fulfilling demand due to the complexity of manufacturing them with near-zero defects. Further, the use of passive LCD technology has required the addition of backlights to allow for viewing in different ambient light conditions. These backlights require additional power thereby further limiting long-term battery operation.

Cathode ray electron beam technology has been present for many years in consumer products such as television (TV) tubes and computer monitors. These devices use what is known as 'hot cathode' electrodes to create a source of electrons that are directed to and focused on the viewing screen. While research has taken place in a number of new technological fields, the field of 'cold cathode' electron emitters such as Spindt-tips and flat emitters has attracted the attention of many manufacturers.

Several problems exist in converting this cold cathode technology into useful products. In general, electron beams need to: deliver sufficient current; be efficient; operate at application-specific low voltages; be focusable; be reliable at required power densities; and be stable both spatially and temporally at a reasonable vacuum for any given application. It has been difficult to achieve high current density, stability and reliability in one cold cathode architecture.

For example, while Spindt tips can provide both spatial and temporal stability and reliability, they can only do so while in a relatively strong vacuum greater than that of outer space thereby making their practical use difficult to achieve. Further, a Spindt tip is relatively difficult to focus compared to flat emitters.

One problem in creating stable and reliable flat emitters is that subsequent manufacturing process steps can easily damage the emission surface once the emitter is formed. For instance, when creating an electron focusing structure, multiple depositions and etching processes can contaminate or create defects within the emission surface of the emitter.

If these problems persist, it will be unpractical to use cold cathode technology in multiple applications that require high speed, low power, and a high density of emitting devices such as with mass storage and display devices used in electronic devices.

SUMMARY OF THE INVENTION

An emitter includes an electron supply and a tunneling layer disposed on the electron supply. A cathode layer is disposed on the tunneling layer. A conductive electrode has multiple layers of conductive material. The multiple layers include a protective layer disposed on the cathode layer. The conductive electrode has been etched to define an opening thereby exposing a portion of the cathode layer.

BRIEF DESCRIPTION OF THE DRAWINGS

The invention is better understood with reference to the following drawings. The elements of the drawings are not necessarily to scale relative to each other. Rather, emphasis has instead been placed upon clearly illustrating the invention. Furthermore, like reference numerals designate corresponding similar though not necessarily exact parts through the several views.

FIGS. 12A and 12B are an embodiment of a first mass storage device that incorporates the invention.

FIG. 13 is an embodiment of a second mass storage device that incorporates the invention.

DETAILED DESCRIPTION OF THE PREFERRED EMBODIMENT

Figure 1:
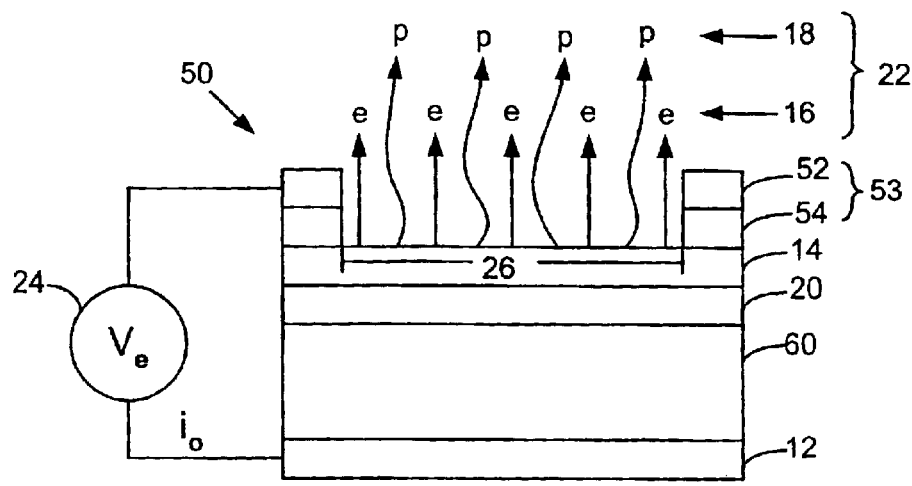
FIG. 1 is a first embodiment of the invention showing an emitter capable of emitting photons and electrons.

The invention allows for the design and manufacture of a highly efficient electron emitter that is also capable of emitting photons. The process design is compatible with conventional semiconductor fab processes and equipment thereby allowing for low cost implementation and scalability for mass production. One aspect of the invention incorporates a sacrificial film within a conductive layer that contacts the cathode of the electron emitter. The sacrificial film is used to protect the cathode surface of the emitter during subsequent processing that includes adding an optional lens structure to the electron emitter. Thus the sacrificial film is also known as a protective film. Other embodiments of the invention take account of a thin-film stack design that includes etch selectivity between different films, as well as etch stop capability and low thermal stress forces between layers. In addition, an exemplary embodiment of a process incorporates a method by which the cathode surface is left substantially free of contaminants and other defects that might affect the operation or operational life of the electron emitter.

The electron lens and emitters disclosed herein are preferably fabricated with semiconductor device technology. The devices of the present invention are applicable to a broad range of semiconductor devices technologies and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also advantageously be employed in gallium arsenide, germanium, and other semiconductor materials or conductive substrates. Accordingly, the present invention is not intended to be limited to those devices fabricated in silicon semiconductor materials, but will include those devices fabricated in one or more of the available semiconductor materials and technologies available to those skilled in the art, such as thin-film-transistor (TFT) technology using polysilicon on glass substrates.

It should be noted that the drawings are not true to scale. Further, various parts of the active elements have not been drawn to scale. Certain dimensions have been exaggerated in relation to other dimensions in order to provide a clearer illustration and understanding of the present invention.

In addition, although the embodiments illustrated herein are shown in two-dimensional views with various regions having depth and width, it should be clearly understood that these regions are illustrations of only a portion of a device that is actually a three-dimensional structure. Accordingly, these regions will have three dimensions, including length, width, and depth, when fabricated on an actual device. Moreover, while the present invention is illustrated by preferred embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

FIG. 1 is an illustration of an embodiment of the invention. An emitter 50 has an electron supply 60 and a cathode 14. Disposed between the cathode 14 and the electron supply 60 is preferably a tunneling layer 20. The cathode 14 and the electron supply 60 are connected to an emitter voltage source 24 using a conductive electrode 53 and supply contact 12, respectively. The conductive electrode 53 has multiple layers of conductive materials including a first protective layer 54 and at least a first conductive layer 52. The conductive electrode 53 is preferably etched to define an opening that exposes a portion of the surface of the cathode 14. The exposed portion of the cathode surface forms an emitter surface 26 that is capable of energy emissions 22 in the form of electrons 16 and photons 18. Using this architecture, the emitting surface has an electron emission rate of about 0.1 to about 8.0 Amps per square centimeter.

Preferably the electron supply 60 is a heavily doped semiconductor substrate such as silicon or a conductive layer deposited on a non-conductive substrate. The doping is preferably n-type doping such as phosphorous, arsenic, or antimony. More preferably, the electron supply is designed to regulate the flow of electrons from the supply contact 12 to the emitter surface 26 such that the emission of electrons over the emitter surface 26 is substantially uniform.

Figure 2:
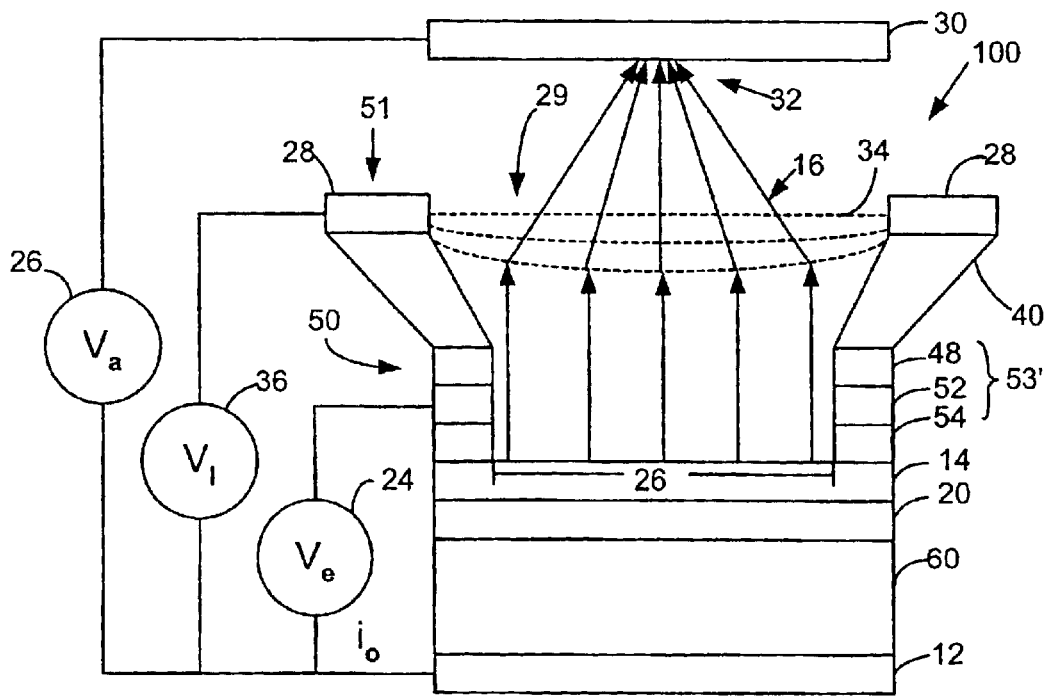
FIG. 2 is a second embodiment of the invention that also includes a focusing lens structure.

FIG. 2 is an illustration of an alternative embodiment of the invention that builds upon the emitter 50 shown in FIG. 1. In this embodiment an electronic lens structure 51 is disposed on the emitter 50 to create an integrated emitter 100. In this exemplary embodiment, a second protective layer 48 is included in the conductive electrode 53' stack of thin-film layers. This second protective layer 48 is used as an etch stop when creating holes within a spacer layer 40. The space layer 40 is disposed on the second protective layer 48 and is preferably made of a dielectric such as TEOS or other low temperature oxide that provides for minimal stress forces due to thermal cycling during processing such as silicon oxide, silicon nitride, or combinations thereof. Disposed on the spacer layer 40 is an electron lens 28. The electron lens 28 has an opening 29 that allows an electric field 34 to form that is used to focus the beam of electrons 16 to create a focused beam 32 on an anode 30. To create the electric field 34, a lens voltage source 36 is connected to the supply contact 12 and the electron lens 28. An anode voltage source 27 is connected to the supply contact 12 and the anode 30. Preferably, the anode voltage source 27 is set at a predetermined voltage such that the electrons 16 are attracted to it.

Figure 3:
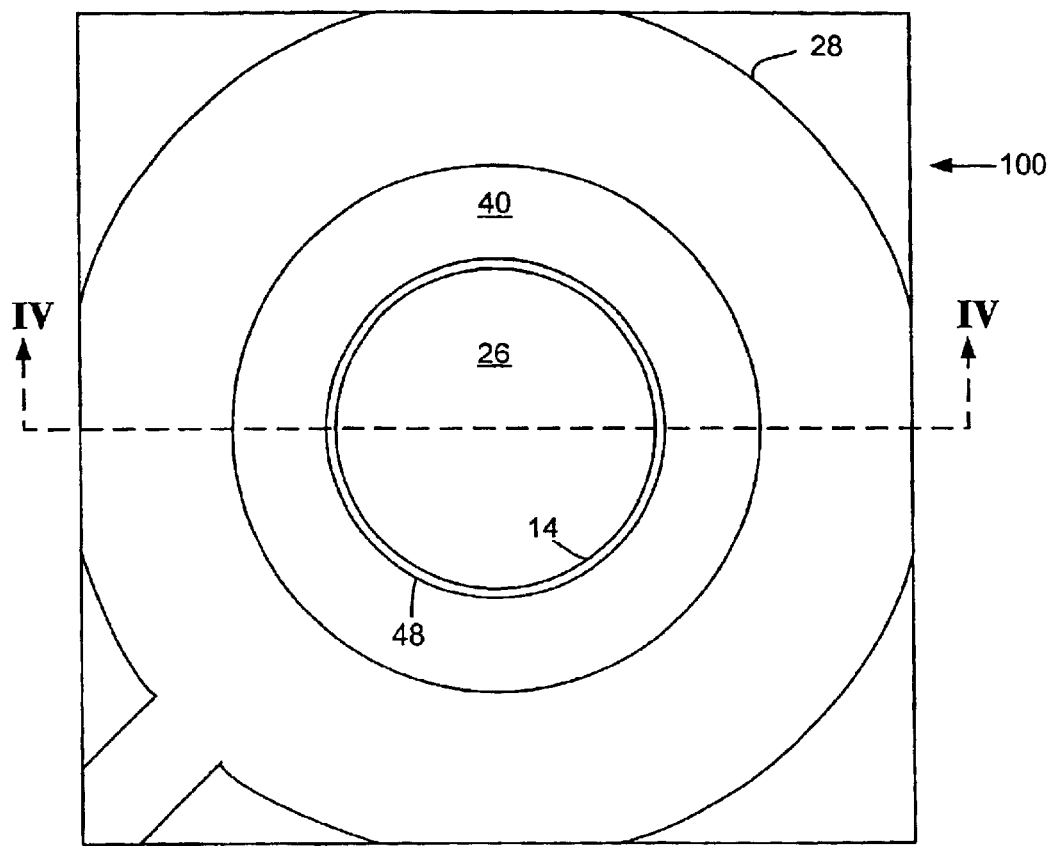
FIG. 3 is a top view of a focusing electron lens that encompasses a third embodiment of the invention.

FIG. 3 is a top view illustration of an exemplary embodiment of an integrated emitter 100 that incorporates the invention. As shown, preferably the integrated emitter is of a circular shape to prevent inadvertent concentrations of electric fields. However, other shapes such as rectangular, octagonal, or other polygonal shapes are possible and still meet the spirit and scope of the invention. The integrated emitter 100 has an electron lens 28 having an opening that exposes the spacer layer 40, perhaps a portion of second protective layer 48 and emitter surface 26 of cathode 14.

Figure 4:
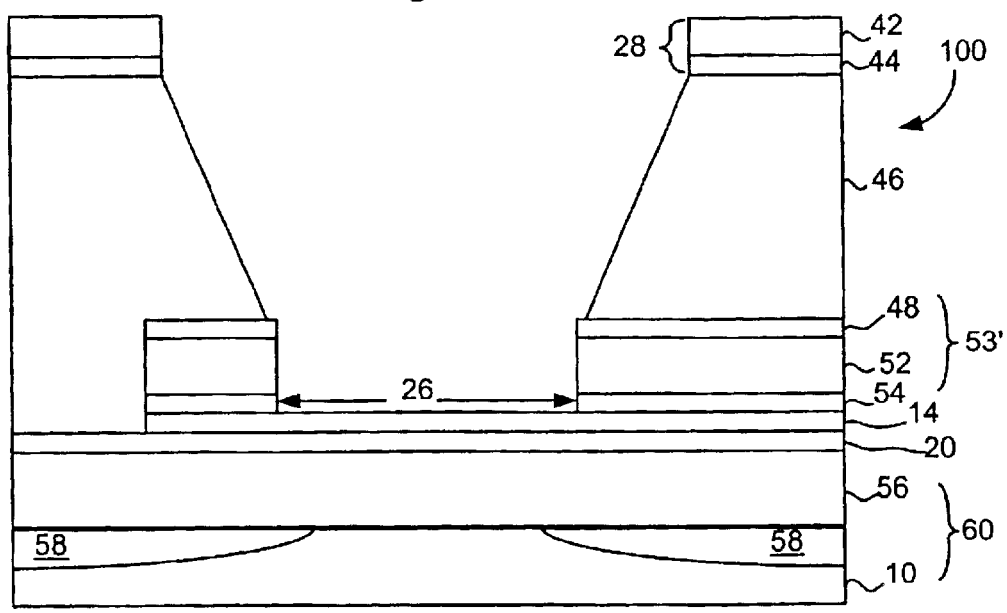
FIG. 4 is a cross-section of the focusing electron lens shown in FIG. 3 along the IV—IV perspective.

FIG. 4 is a cross-section of the integrated emitter 100 of FIG. 3 taken along the IV—IV view. In this exemplary embodiment, the integrated emitter 100 is built upon a semiconductor substrate 10, preferably silicon that is also preferably heavily doped with N+ donors to provide an ample supply of electrons. Formed with or on the surface of substrate 10 is an emitter isolation layer 58. The isolation layer 58 is preferably made of field oxide (FOX) that is grown on substrate 10. Optionally, the isolation layer 58 can be a dielectric layer that is deposited or otherwise applied to substrate 10. Within the isolation 58 is an opening that allows electrons to leave the substrate 10. An optional anisotropic conductivity or nodule layer shown as emission layer 56 is deposited on the exposed surface of the substrate 10. The substrate 10 and the emission layer 56 form the electron supply 60 for this exemplary emitter. The emission layer 56 provides for substantially a uniform supply of electrons across the emitter surface 26 to provide uniform emissions.

Disposed on the electron supply 60 is a tunneling layer 20 that preferably is unpatterned to minimize process contamination and extends across the surface of substrate 10. Disposed on a portion of the tunneling layer 20 is a cathode 14. Disposed on the cathode 14 is a conductive electrode 53' that includes a first protective layer 54 and a second protective layer 48 both used as etch stops during manufacturing. Defined within the conductive electrode 53' is an opening to the cathode 14 which creates the emitter surface 26. The conductive electrode 53' is formed of multiple layers of conductive thin-film material such as first protective layer 54, first conductive layer 52, and second protective layer 48. Depositing titanium or molybdenum preferably creates the first and second conductive layers. Disposed upon the conductive electrode 53' and a portion of the tunneling layer is a spacer layer 46 formed from a dielectric such as TEOS to a thickness of about 5 microns, for example. Disposed on the spacer layer 46 is an electrons lens 28 that is formed of a second conductive layer 42 and optionally an adhesion layer 44.

Figure 5:
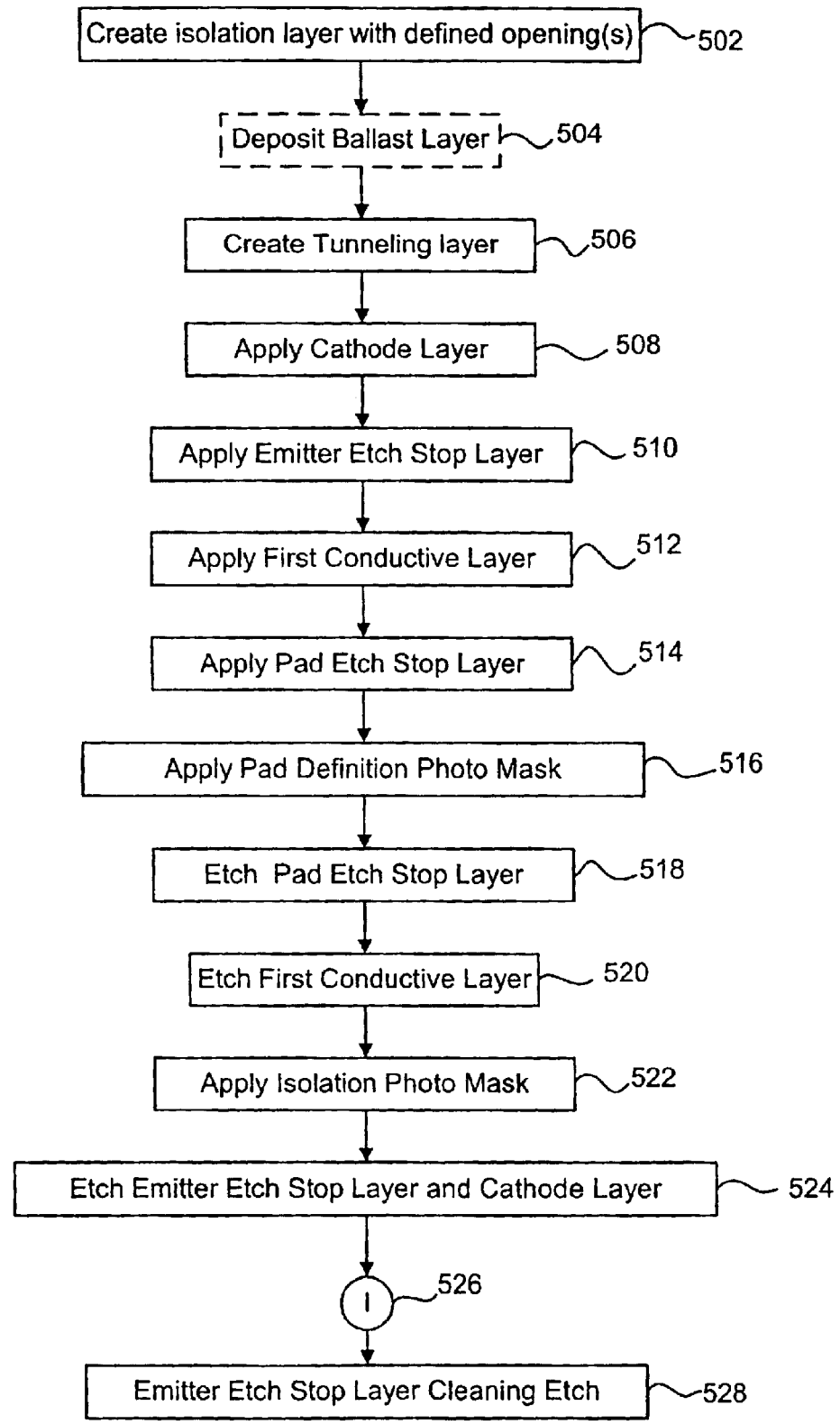
FIG. 5 is an exemplary flow chart of a process used to create an emitter incorporating an embodiment of the invention.
Figure 6:
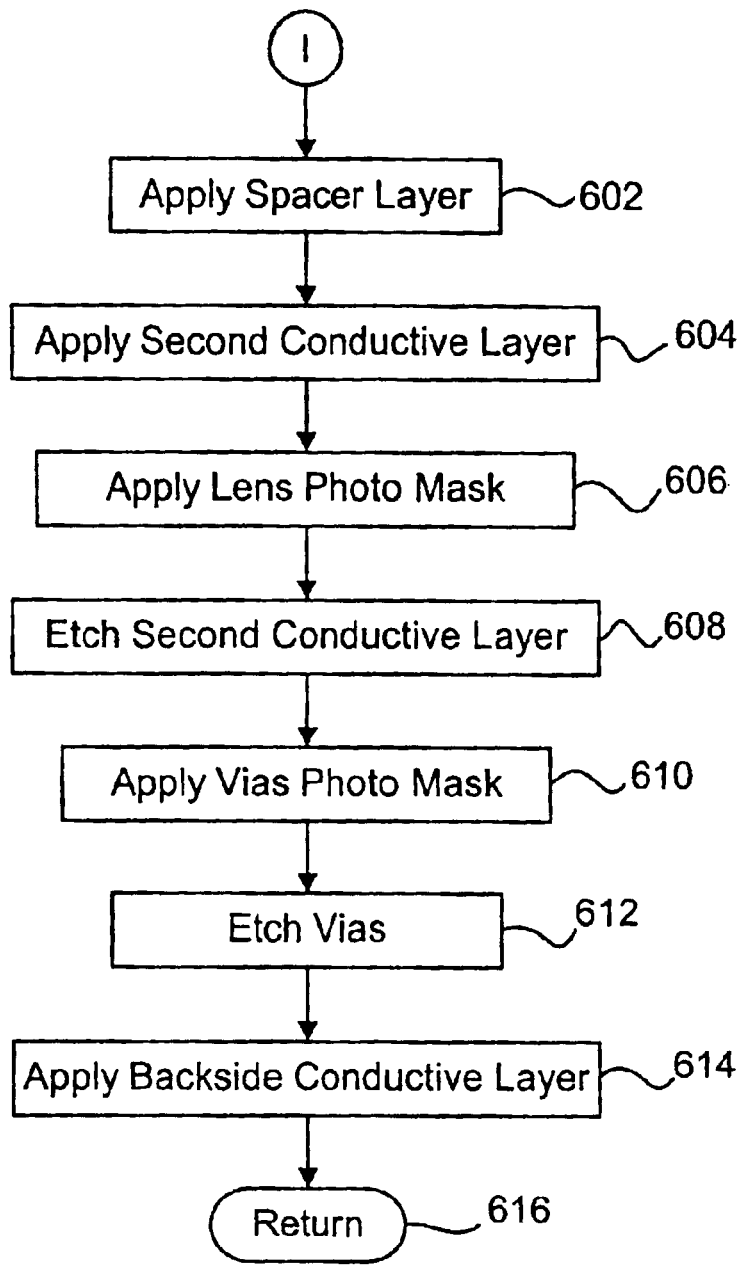
FIG. 6 is an exemplary flow chart of a process used to add a lens structure to an embodiment of the invention.
Figure 7A:
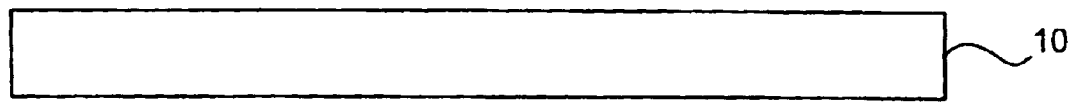
FIGS. 7A–7T are exemplary cross-sections of various process steps used to create embodiments of the invention.
Figure 7B:
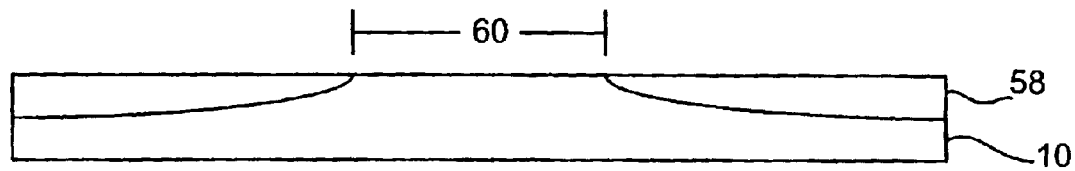
Figure 7C:
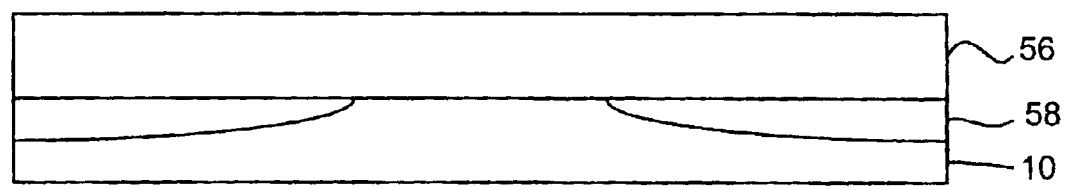
Figure 7D:
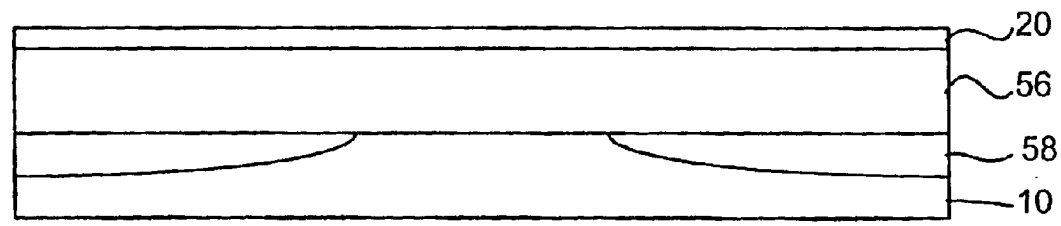

FIGS. 5 and 6 are flow charts of exemplary process steps used to create embodiments of the invention. FIGS. 7A–7T are exemplary illustrations of the intermediate process steps used to create the emitter and are shown to better define and understand the invention. Actual dimensions are not to scale and some features are exaggerated to more clearly point out the process step.

FIG. 5 is an exemplary process flow chart to create an exemplary embodiment of the invention. First, the emitter active region is defined. In step 502, an isolation layer 58 is created with defined openings on a substrate 10 (see FIG. 7A) preferably by a field oxide layer (FOX) grown on the substrate 10 (see FIG. 7B) with defined openings to create an electron supply 60. This step is preferably performed using a recessed field oxidation process (oxidation/etch/oxidation) to provide a better planar surface and to reduce birdsbeak at the FOX edge. The FOX thickness is preferably about 4500 Angstroms and the height from the FOX surface to the surface of the substrate 10 is about 200 Angstroms.

Several different materials for substrate 10 that may be used include aluminum, tungsten, titanium, copper, gold, tantalum, platinum, iridium, palladium, rhodium, chromium, magnesium, scandium, yttrium, vanadium, zirconium, niobium, silicon, beryllium, hafnium, silver, and osmium. The substrate may also be any alloys and multilayered films of the previously stated substrate materials. Other possible substrates include doped polysilicon, doped silicon, graphite, metal-coated glass, ceramic, plastic, and indium-tin-oxide coated glass. The substrate material may be patterned or unpatterned. Conventional methods such as chemical-mechanical polishing (CMP) can planarize the top surface of the conductive substrate as required by a given application.

Besides FOX, isolation layer 58 may be created by using deposition or thermal growth of other materials such as oxides, nitrides, and oxynitrides of silicon, aluminum, titanium, tantalum, tungsten, hafnium, zirconium, vanadium, niobium, molybdenum, chromium, yttrium, scandium, nickel, cobalt, beryllium, magnesium, diamond like carbon and combinations thereof.

In optional step 504, an emission layer 56 (such as an anisotropic conductivity layer or nodule layer) is formed over the surface of the substrate (see FIG. 7C) and isolation layer 58 to substantially uniformly distribute electrons from the substrate to latter defined emitter surfaces. The emission layer 56 is preferably formed using polysilicon with a thickness of about 0.1 to 2 microns. The polysilicon can be optionally anodized or non-anodized. An exemplary nodule layer is described and shown in commonly assigned U.S. patent application Ser. No. 09/975,296 filed Oct. 12, 2001, herein incorporated by reference. An exemplary anisotropic conductivity layer is described and shown in commonly assigned US patent application attorney docket No. 10019410-1 filed concurrent with this application, herein incorporated by reference.

Depending on how the polysilicon is fabricated an anisotropic conductivity layer or nodule layer can be created. An anisotropic conductivity layer is formed when the polysilicon has a uniform surface but an anisotropic resistive profile in the Z and X-Y directions. The Z direction is in regard to the polysilicon thickness. The X-Y direction is in regard to the polysilicon length and width dimensions. An nodule layer is created by a layer of polysilicon that has multiple protrusions that create localized high electric fields to enhance the electron emission forms. By using an anisotropic conductivity layer or an nodule layer as emission layer 56 the emission rate, stability and reliability of the emitter are enhanced.

In step 506, a tunneling layer 20 is created on the surface of the substrate. Preferably the tunneling layer 20 is unpatterned to prevent defects from forming. If the optional emission layer 56 is used the tunneling layer 20 is deposited over it (see FIG. 7D). If the emission layer 56 is not used, the tunneling layer is deposited, grown, or otherwise applied to the substrate within the defined openings of the isolation layer. Preferably the tunneling layer 20 is RTP oxide grown from the poly-silicon anisotropic conductivity or nodule layer to a thickness of about 200 Angstroms. If using an RTP process for other than a poly-silicon anisotropic conductivity or nodule layer, in order to have uniform oxide thickness and temperature control for the RTP process, a non-metal emission layer 56 is required.

Besides polysilicon, using deposition or thermal growth of other materials such as oxides, nitrides, and oxynitrides of silicon, aluminum, titanium, tantalum, tungsten, hafnium, zirconium, vanadium, niobium, molybdenum, chromium, yttrium, scandium, nickel, cobalt, beryllium, magnesium, diamond like carbon and combinations thereof may create the isolation layer 58.

Figure 7E:
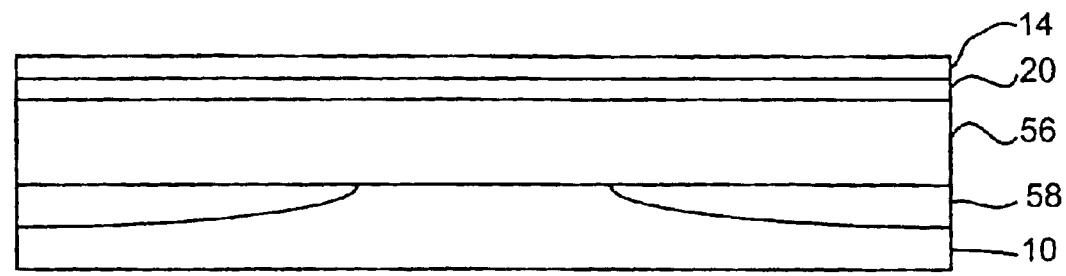

In step 508, a cathode layer 14 is applied over the surface of the tunneling layer 20 (see FIG. 7E). The cathode layer 14 is preferably formed from a deposition of about 100 Angstroms of platinum (Pt) or optionally gold (Au). When using gold as the cathode layer 14, it is preferable to deposit up to about 10 Angstroms of tantalum before depositing a 50 to 100 Angstrom or more preferably 70 Angstrom layer of gold. The tantalum layer is used to provide better adhesion of the gold to the tunneling layer 20 and to prevent the gold from migrating into the tunneling layer. The cathode layer 14 will be placed at a positive potential relative to the electron source to create an electric field across the thickness of the tunneling layer 20 to cause the electrons to tunnel through the tunneling layer and be pulled to the cathode layer 14 with sufficient velocity that some escape to form the energy emission 22. The photons are thought to emitted by the electrons colliding into the cathode material and causing electron phonon scattering and part of the energy loss is due to photon creation.

Besides platinum or gold other possible cathode layer 14 materials include aluminum, tungsten, titanium, molybdenum titanium, copper, silver, tantalum, iridium, palladium, rhodium, chromium, magnesium, scandium, yttrium, vanadium, zirconium, niobium, molybdenum, hafnium, osmium, other refractory metals and any alloys or multilayered films thereof. Other possible cathode surfaces include doped polysilicon, graphite, or combination of metal and non-metal such as conductive carbon or other films. Preferably, the material chosen for cathode layer 14 does not oxidize to an insulating native oxide.

Figure 7F:
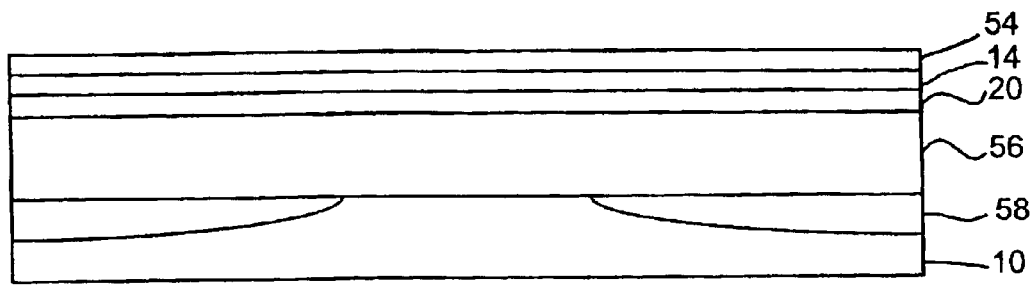

In steps 510–516, a conductive electrode is applied to the cathode surface. In step 510, an emitter etch stop layer, the first protective layer 54, is applied over the cathode layer 14 to prevent it from being damaged or contaminated during subsequent processing (see FIG. 7F) thus becoming a sacrificial layer. The pad etch stop layer is preferably created using a deposition of about 300 to about 1500 Angstroms but more preferably about 800 Angstroms of titanium (Ti) or molybdenum.

Besides titanium or molybdenum other possible protective layer 54 materials useful for a sacrificial layer include aluminum, tungsten, molybdenum titanium, copper, silver, tantalum, iridium, palladium, rhodium, chromium, magnesium, scandium, yttrium, vanadium, zirconium, niobium, hafnium, osmium, and any alloys thereof.

Figure 7G:
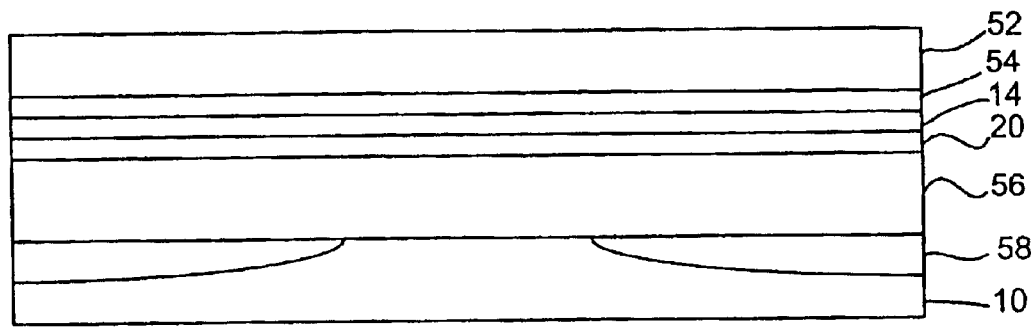

In step 512, a first conductive layer 52 is applied over the emitter etch stop layer (see FIG. 7G). The first conductive layer is preferably created using a deposition or plating of about 2000 Angstroms of gold (Au). This first conductive layer forms the metal trace and electrically contacts to the cathode surface through the first protective layer 54 to transform the electric field from the power supply to the emitter.

Figure 7H:
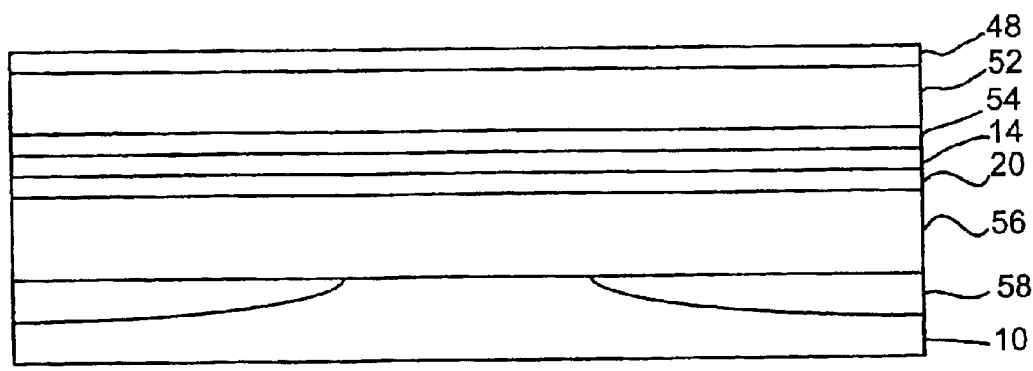

In step 514, a pad etch stop layer, second protective layer 48, is applied on the first conductive layer 52 (see FIG. 7H). The pad etch stop layer is preferably about 300 to about 1500 Angstroms but more preferably about 800 Angstroms of Ti or molybdenum and is used as an etch stop for the spacer layer etch to protect the first conductive layer from sputtering during the subsequent spacer layer etch.

Figure 7I:
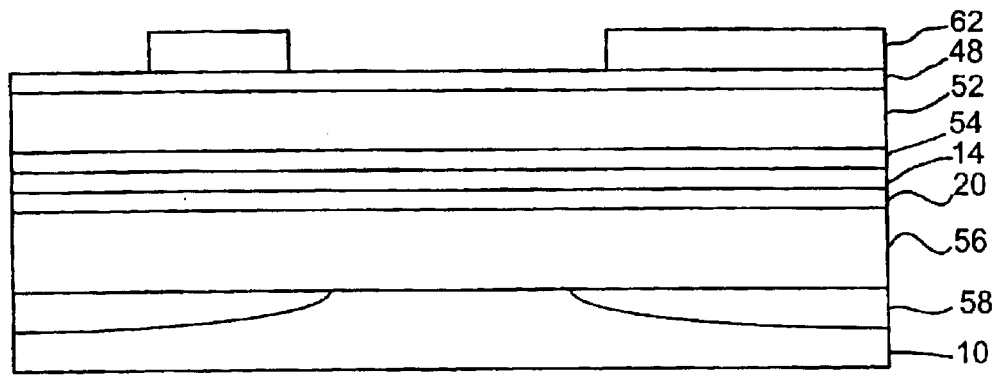

In step 516, a pad definition photo mask 62 is applied on the pad etch stop layer (see FIG. 7I). The pad definition photomask 62 is patterned to define the shape, location, isolation and opening(s) of the emitter(s).

Figure 7J:
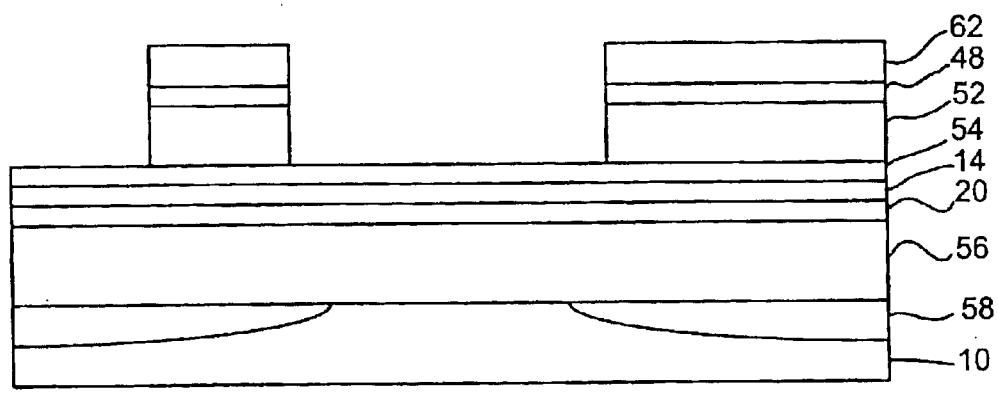

In steps 518 and 520, the pad etch stop layer and first conductive layers are preferably wet etched, respectively, using the appropriate etchant (see FIG. 7J). Several different solutions can be used. For example, a 311 etch solution of ammonia and water ($H_2O:NH_4OH:H_2O_2=3:1:1$), a dilute BOE, or preferably a sulfuric peroxide etch ($H_2O_2:H_2SO_4=1:2$) may be used when the pad etch stop layer is Ti. Using the sulfuric peroxide etch for about 5 min with about 800 Angstroms of Ti is sufficient and preferable. The wet gold etch is preferably done with a solution of 331 (DI:Nitric:HCl=3:3:1) for an etch time of about 15 to 30 seconds for gold thickness of about 2000 Angstroms.

Figure 7K:
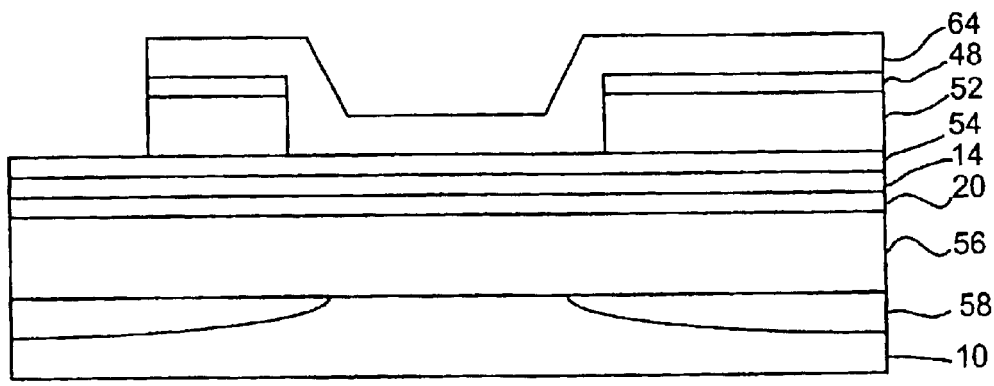

In step 522, an isolation photo mask 64 is applied and patterned to protect the emitter surface and just expose the first protective layer 54 that is not part of the emitter (see FIG. 7K).

Figure 7L:
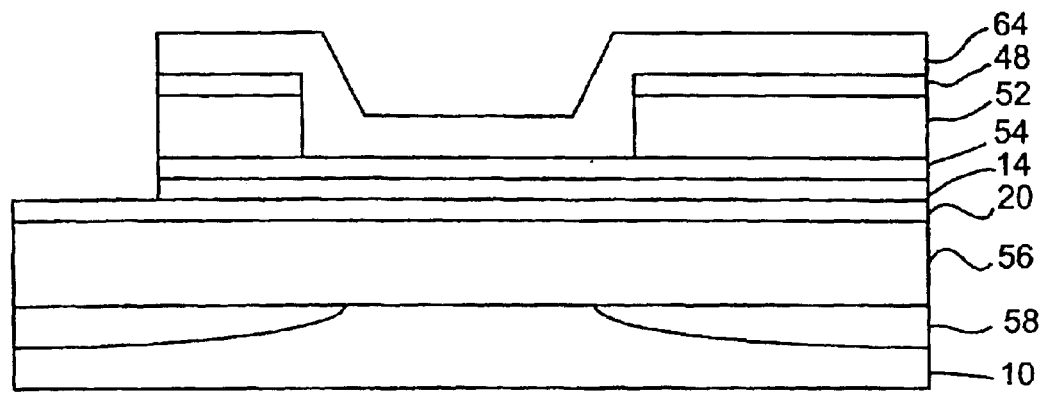
Figure 7M:
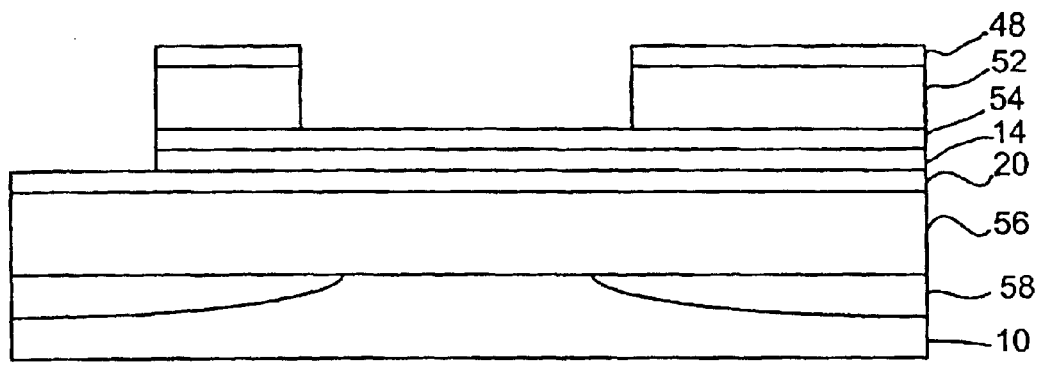
Figure 7N:
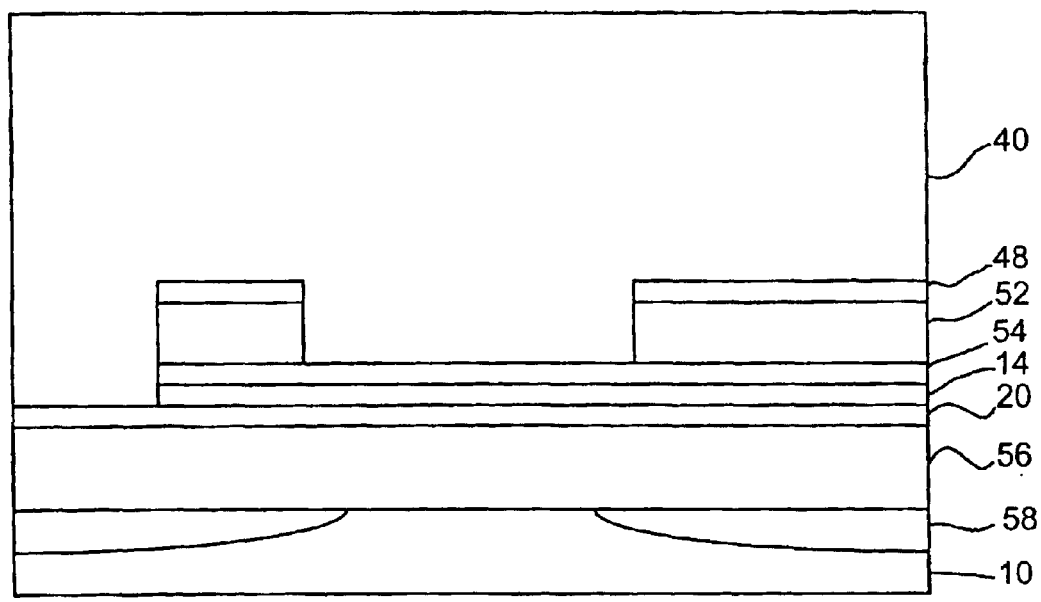

In step 524, the first protective layer 54 and the cathode layer 14 are preferably dry etched to separate and isolate each emitter (see FIG. 7L). The isolation photo mask 64 is then removed (see FIG. 7M).

If the emitter is to be used without a focusing lens, then the process proceeds to step 528 where the emitter etch stop layer, the first protective layer 54, is subjected to a special cleaning etch to remove substantially all of the first protective layer 54 from the emitter surface 26 (see FIG. 7T).

If the emitter is to be integrated with a focusing lens structure, the first protective layer 54 is left on the cathode layer 14 and the process proceeds to the steps used to form a lens structure shown in FIG. 6. In step 602, a spacer layer 40 is applied onto the surface of the processed substrate with the emitter. Several different dielectric films can be used, preferably a low temperature oxide, but the selection process preferably considers interfilm stress and interfilm etch selectivity. If the stress between the spacer layer 40 and the processed substrate is too great a substrate may warp (especially when the substrate is a conventional semiconductor silicon substrate). This warping can cause errors in the photo processes. For the thin-films previously selected, tetraethylorthosilicate (TEOS) film provides an acceptable low stress of less than about an absolute value of 100 mPascals or more preferably in the range of −40 to −60 mPascals for a 5 micron thick film. After depositing the spacer layer, it may be optionally planarized using conventional planarization equipment and processes in order to form a substantially flat surface for the electronic lens made with the second conductive layer 42.

Figure 7O:
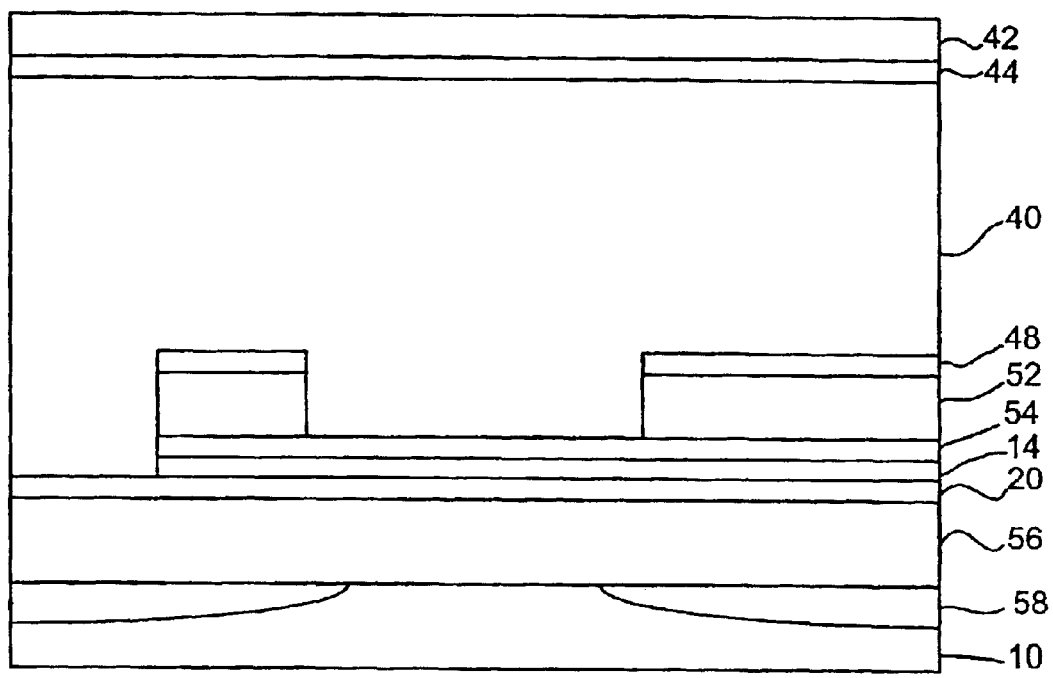

In step 604 a second conductive layer 42 is applied on the surface of the spacer layer 40. Optionally, an adhesion layer 44 may be applied first to provide a good interface between the dielectric layer 40 and the second conductive layer 42 (see FIG. 7O). Exemplary choices are about 500 Angstroms of deposited tantalum for the adhesion layer 44 and about 1000 Angstroms of deposited gold for the second conductive layer.

In step 606, a lens photomask 66 is applied on the second conductive layer 42 and patterned to define an opening that is used to focus electrons later emitted from the emitter surface.

Figure 7P:
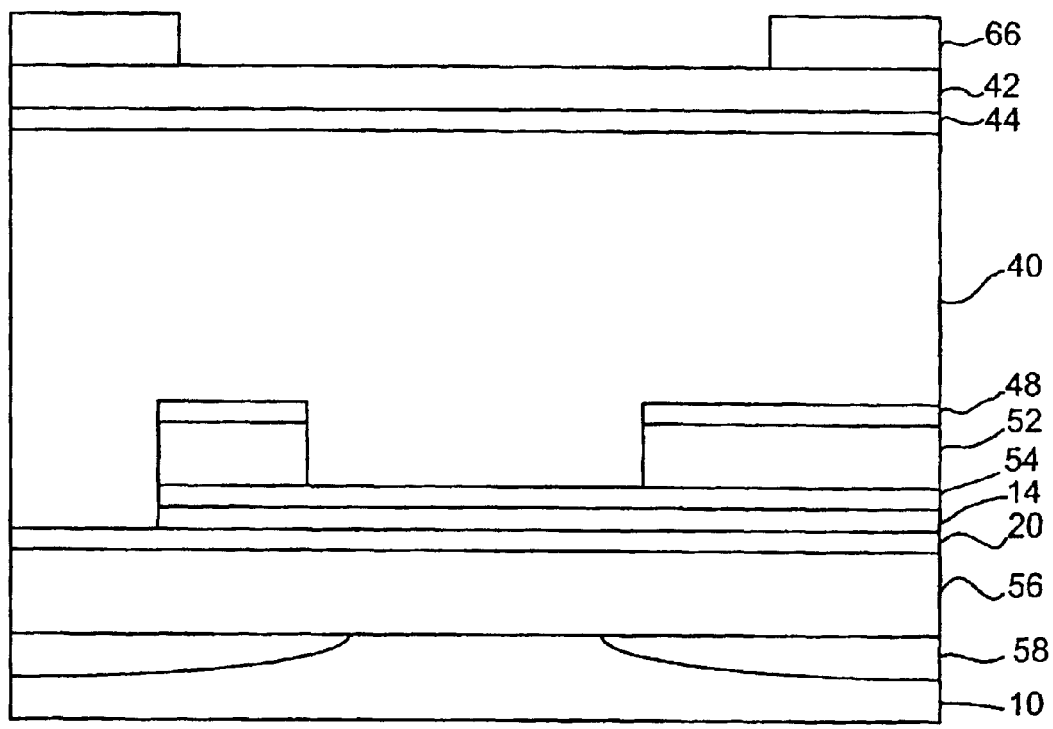
Figure 7Q:
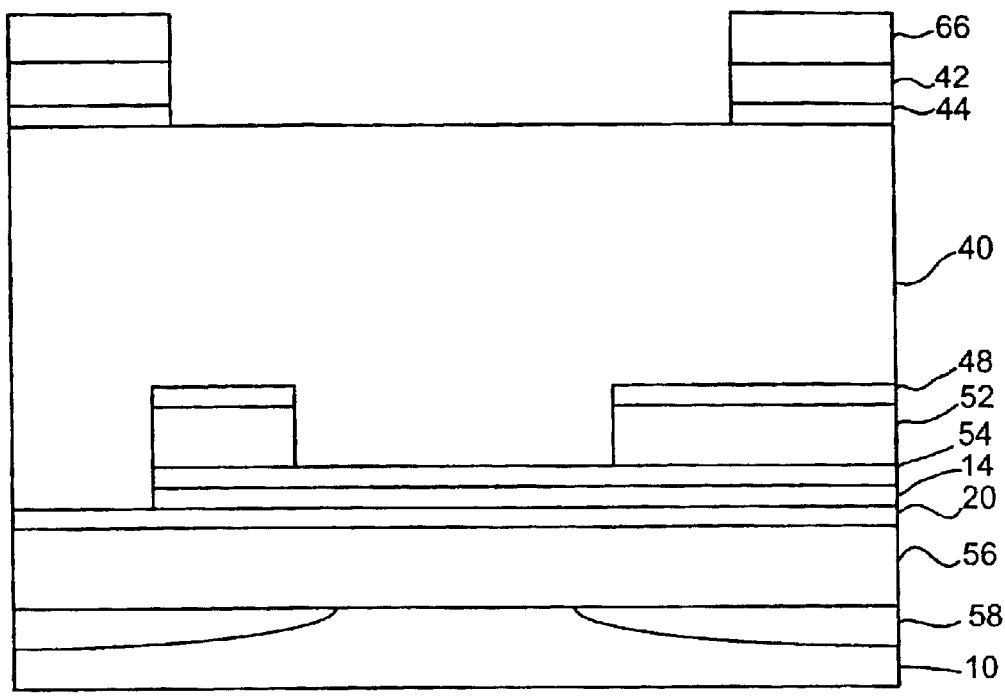

In step 608, the second conductive layer is etched, preferably with a dry or wet etch to define the lens geometry and optionally a partial shield layer used to prevent electrostatic attraction with an anode layer at a different potential than the electron lens (see FIG. 7P).

In step 610, a via photomask 67 is applied and patterned to define an opening in substantial alignment with the electron lens opening in the second conductive layer to allow for subsequent etching of a via through the spacer layer 40.

Figure 7R:
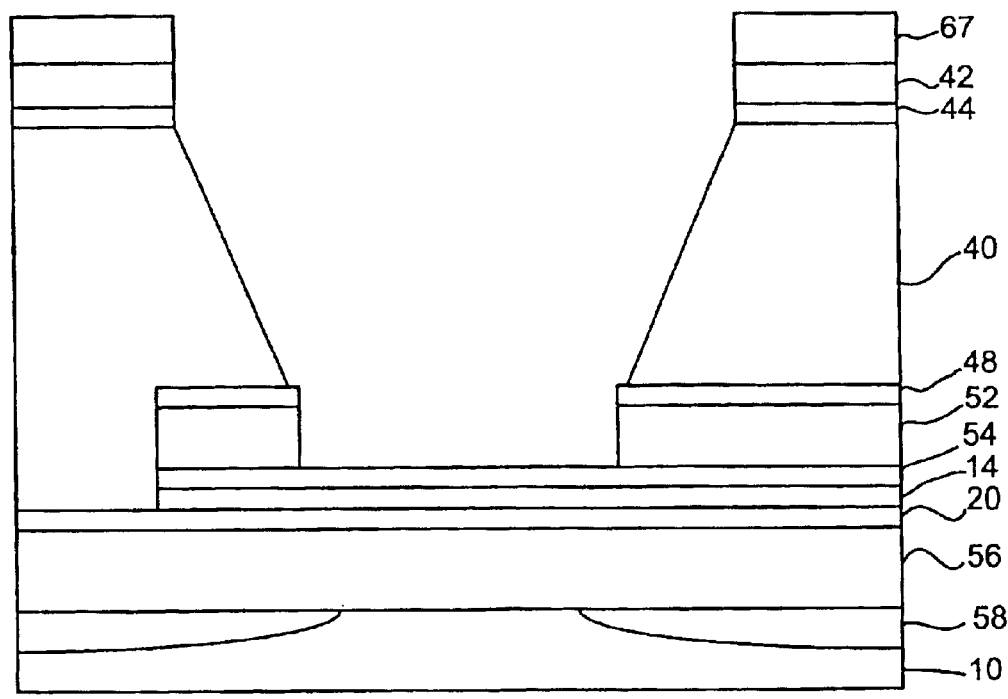

In step 612, the vias through the spacer layer 40 are etched to the first protective layer 54 (see FIG. 7R). Removal of the spacer layer 40 from the emitter surface while at the same time stopping on the first protective layer 54 is influential in designing an etch process with TEOS film for the spacer layer 40. Any residue of the spacer layer 40 on the emitter will block electron and photon emissions. However, failure to stop on the first protective layer 54 will damage or totally sputter out the cathode. A thicker first protective layer 54 allows for more spacer layer etch margin but there is the risk of more undercut during subsequent etching of the first protective layer. Empirical testing has shown that the rate of undercut is about 1 micron for 500 Angstroms of thickness for the first protective layer 54 when using titanium.

An exemplary spacer layer 40 plasma etch process has the following parameters: 900 Watts of RF power; 300 mTorr pressure; electrode gap 1.3 cm; and gas flow of 20 sccm CHF3+20 sccm CF4+275 sccm Ar. The etch rate for TEOS is about 4550 Angstroms/minute. This etch provides etch selectivity to both photoresist and titanium used for the first protective layer. The selectivity ratio is about 7:1 for resist and 20:1 for titanium. Other etch processes can be used and still meet the spirit and scope of the invention. Preferably, the etch selectivity ratio for the spacer layer and the protective layer should be greater than 10:1 and more preferably within the range of 10:1 and 50:1.

Figure 7S:
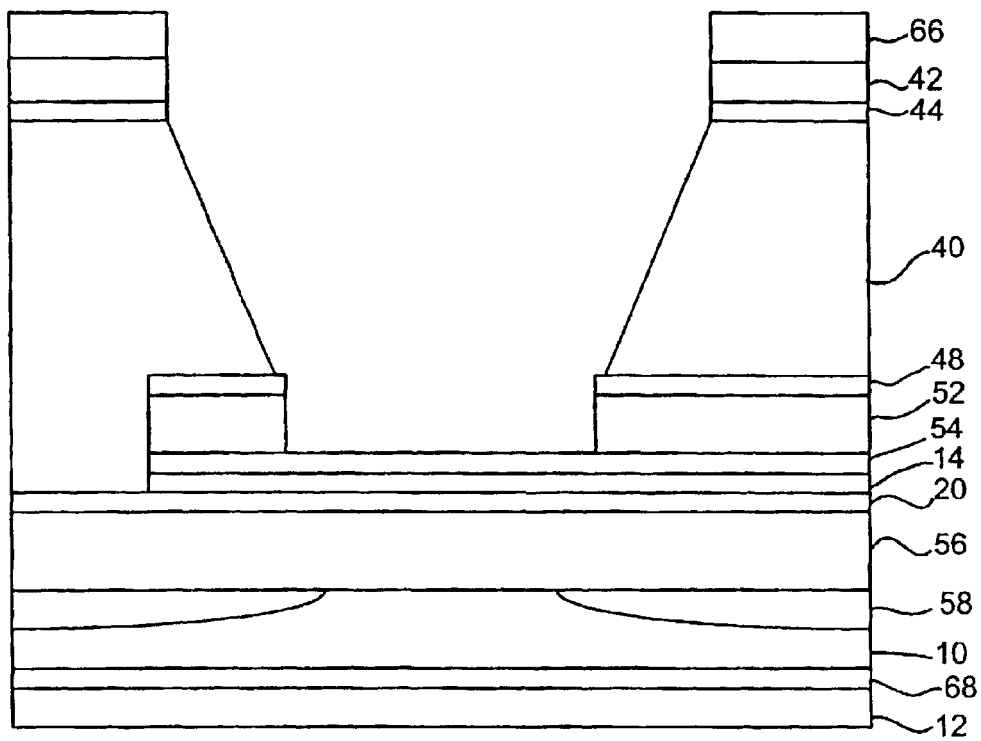
Figure 7T:
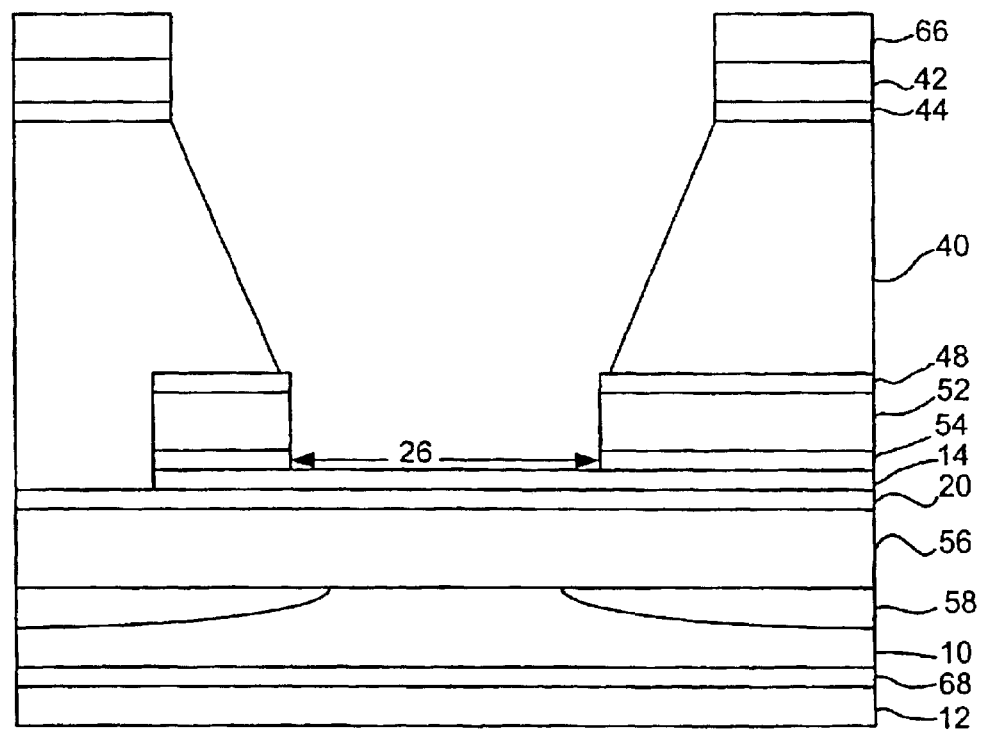

In optional step 614, a backside conductive layer is applied to the back of the substrate 10 to create the supply contact 12. Optionally, a contact adhesion layer 68 can be applied to the back of the substrate 10 before applying the supply contact 12 (see FIG. 7S). Another method of contacting the substrate includes using doped substrate contacts on the top surface. Several other methods of contacting the substrate are known to those skilled in the art.

In step 616, the processed substrate is returned to perform the etching of the first protective layer to remove and clean the emitter surface 26 of substantially all the residue of the first protective layer 54 in step 528 of FIG. 5 (see FIG. 7T). As stated previously, this etch step is to clean the first protective layer completely as possible to prevent defects from being created on the emitter surface 26. Several different solutions can be used. A 311 etch solution of ammonia and water ($H_2O:NH_4OH:H_2O_2=3:1:1$), a dilute BOE, or preferably a sulfuric peroxide etch ($H_2O_2:H_2SO_4=1:2$) may be used when the pad etch stop layer is Ti. Using the sulfuric peroxide etch for about 5 min with about 800 Angstroms of Ti is sufficient providing the bath lifetime and temperatures of etching are kept under control.

Figure 8:
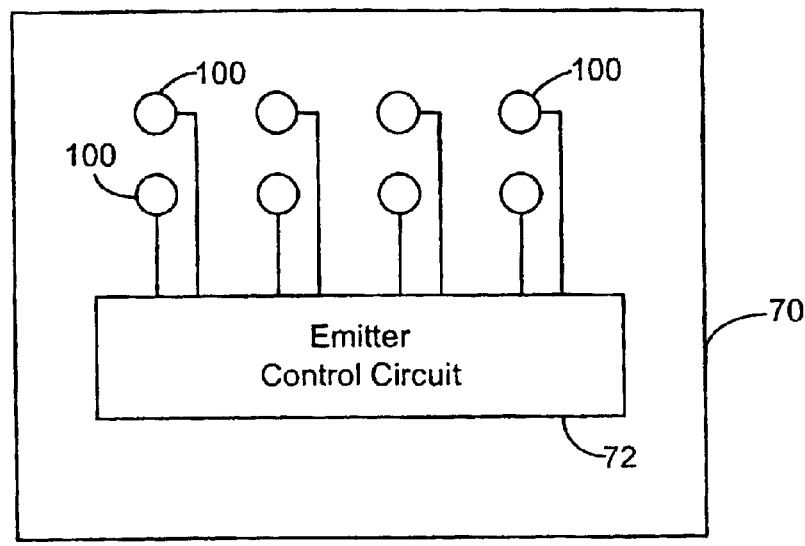
FIG. 8 is a fourth embodiment of the invention incorporated within an integrated circuit with control circuitry.

FIG. 8 is an exemplary embodiment of the invention in the form of an integrated circuit 70 that has one or more integrated emitters 100 arranged in an array and controlled by emitter control circuitry 72. The emitter control circuitry allows for individual control of each integrated emitter 100. By controlling the thickness of the tunneling layer 20, the turn on voltage of the integrated emitters can be chosen such that the integrated circuit can be fabricated with conventional CMOS, BiCMOS, or custom CMOS/HVCMOS circuitry. By being able to use conventional semiconductor processes the cost is lowered and the ability to mass-produce combined emitters and circuitry is possible.

Figure 9:
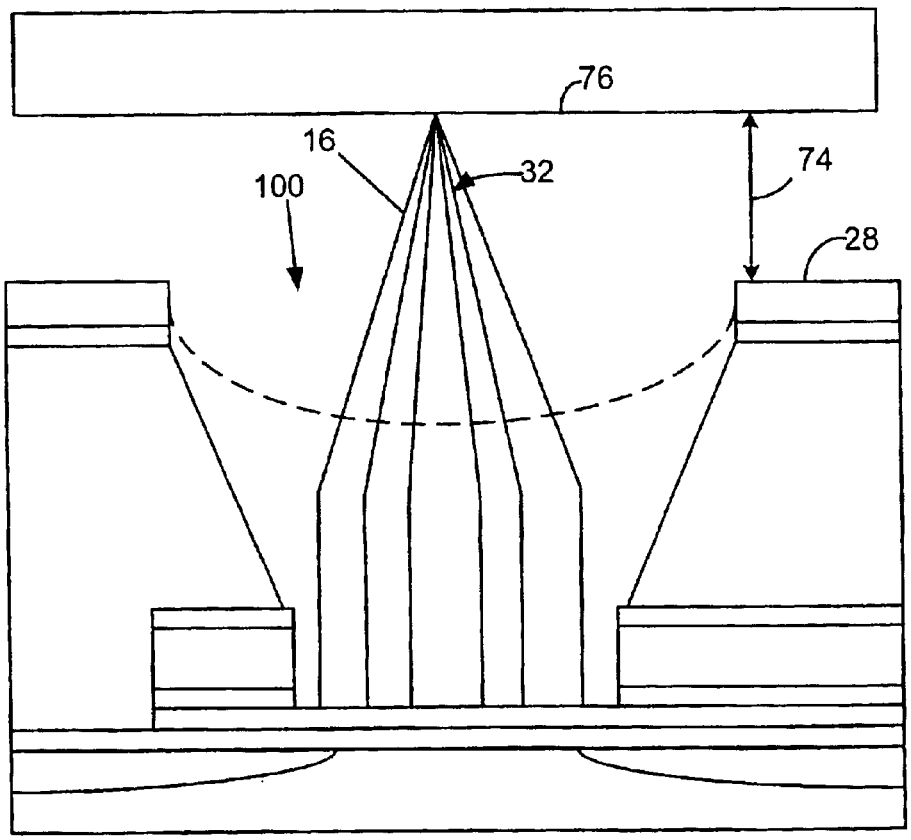
FIG. 9 is a fifth embodiment of the invention illustrating the focusing of an electron beam onto an anode surface.

FIG. 9 is another embodiment of an integrated emitter 100 that includes an anode surface 76, such as a display screen or a programmable media surface that is affected by the electrons 16 when they are preferably formed into a focused beam 32. The anode surface 76 is held at a predetermined distance 74 from electron lens 28. In this embodiment the integrated emitter is shown fabricated without an anisotropic conductivity or nodule layer as emission layer 56, however, it may be optionally included.

Figure 10:
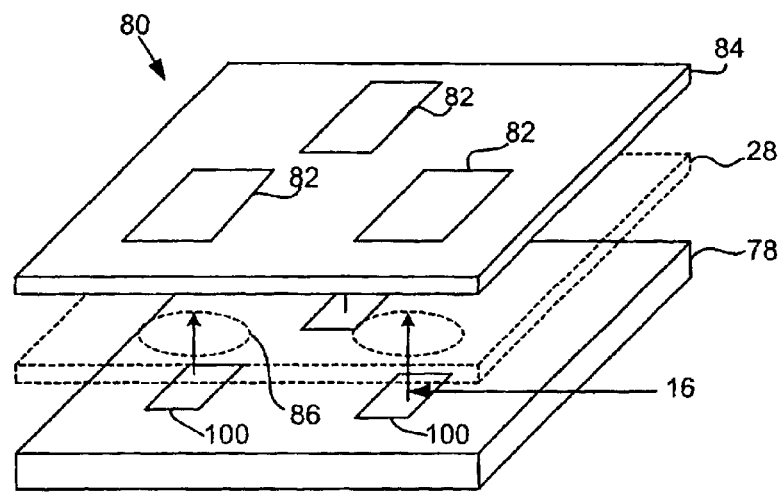
FIG. 10 is an embodiment of the invention incorporated into a first display device.

FIG. 10 is an alternative embodiment of the invention in a conceptual display 80. The display is made up of preferably an array of pixels 82, which further preferably are arranged in a red, blue, green order but could also be a monochromatic color. The pixels 82 are formed on a display screen 84. An emitter array 78 has one or more integrated electron emitters 100 incorporating the invention, shown as rectangular shaped flat emitters, which are individually controlled to create electron emissions 16. The electron emissions 16 are focused using an electron lens 28 preferably made of a conducting layer of material such as aluminum, gold, or other metal or semiconductor thin-films. The electron lens 28 is disposed between the display screen 84 and the emission array 78. Typically, the display screen 84 is held at a voltage potential greater than 500 volts, such as 700 volts for example, to attract the electron emissions 16. The electronic lens 28 has lens openings 86 that focus the electron emissions 16 onto a spot size on pixels 82 on display screen 84. The electron lens 28 is held at a voltage potential relative to the emitter surface, such as a negative 20 volts, to create an electric field around and in the lens opening 86 to create the electronic lens. The difference in voltage potential between the display screen 84 and the emitter array 78 and electronic lens 28 creates an electrostatic attractive force, which causes the display screen 84 to be attracted to the electronic lens 28 and the emitter array 78. To minimize this attractive force, an optional shield layer (not shown) is disposed between the display screen 84 and the electron lens 28. The shield layer has shield openings preferably the same geometry and size as lens opening 86, to allow the electron emissions 16 to pass through the shield layer to the display screen 84.

Figure 11:
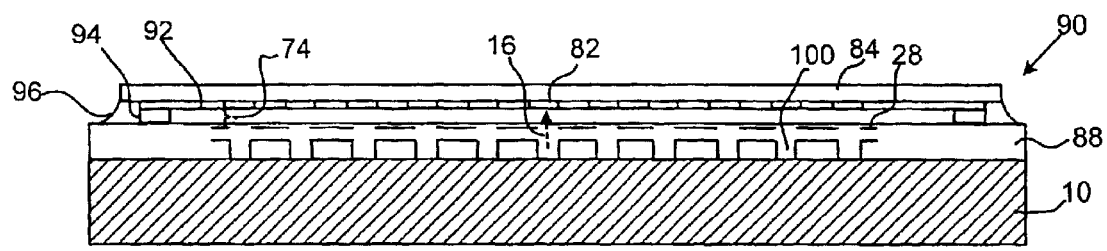
FIG. 11 is an embodiment of the invention incorporated into a second display device.

FIG. 11 is an alternative embodiment of the invention in the form of an integrated display device 90. The integrated display device 90 is formed of a substrate 10, preferably a silicon substrate but optionally another type of semiconductor or alternatively a glass substrate. Several possible substrates of such materials are known to those skilled in the art. The substrate 10 in this exemplary design has a stack of thin-film layers 88 created on the substrate 10. The stack of thin-film layers 88 incorporates preferably an array of integrated emitters 100, incorporating the invention. The integrated emitters 100 are illustrated here as being flat emitters for each pixel phosphor 82, but more than one flat emitter may be present per pixel phosphor 82. Each integrated emitter 100 is capable of creating an electron emission 16 that is focused with an electronic lens 28 embedded within the stack of thin-film layers 88 and disposed between the screen anode 92 and the substrate 10. The screen 84 is spaced apart from the stack of thin-film layers 88 by a spacer 94 to an anode-lens distance 74. Spacer 94 is selected and fabricated from several optional materials known to those skilled in the art. Preferably, spacer 94 also provides an airtight seal but optionally, an alternative seal 96 or an adhesive can be applied around the periphery of the integrated display device 90.

FIGS. 12A and 12B are an alternative embodiment of the invention used in a conceptual mass storage device 110. Conceptual mass storage device 110 is exemplarily illustrated as preferably having three different substrates arraigned in a vertical stack. A substrate 10 has a stack of thin-film layers 88 formed on one surface that includes integrated emitters 100 and a electronic lens 28. The integrated emitters 100 and the electronic lens 28 creates a focused beam 32 that creates a small spot size, preferably less than 40 nanometers such as about 10 nanometers, on a media surface 102 on a rotor substrate 106 disposed between the substrate 10 and a stator substrate 108. The media surface 102 on rotor substrate 108 is preferably made of a phase-change material that is affected by the energy of the focused beam 32. The phase-change material is able to change from a crystalline to an amorphous state 126 by using a high power level of focused beam 32 and rapidly decreasing the power level of focused beam 32. The phase-change material is able to change from an amorphous state 126 to the crystalline state by using a high power lever of focused beam 32 and slowly decreasing the power level so that the media surface has time to anneal to the crystalline state. An exemplary material is germanium telluride (GeTe) and ternary alloys based on GeTe.

Several other phase-change materials are known to those skilled in the art and can be substituted without departing from the scope and spirit of the invention. Some examples of other preferable phase-change materials are chalcogenide alloys such as: GaSb, InSb, InSe, $Sb_2Te_3$, $Ge_2Sb_2Te_5$, InSbTe, GaSeTe, $SnSb_2Te_4$, InSbGe, AgInSbTe, (GeSn)SbTe, GeSb(SeTe), $Te_{81}Ge_{15}Sb_2S_2$ and GeSbTe.

The rotor substrate 106 and the stator substrate 108 contain electronic circuitry to enable rotor substrate 106 to move in a first and preferably second direction to allow a single integrated emitter 100 to read and write multiple locations on the media surface.

To read from the media surface, a lower-energy focused beam 32 strikes the media surface on media 102 that causes electrons to flow through the media substrate 106 and a reader circuit 104 detects them. The amount of current detected is dependent on the state, amorphous or crystalline, of the media surface struck by the focused beam 32. The operation of an exemplary reader circuit 104 is shown as having a first contact 128 connected to the media surface 102 and a second contact 129 connected to the media substrate 106. Current that flows within the substrate is converted to voltage by amplifier 130 to create a reader output 132. Other reader circuits are known by those skilled in the art and can be substituted without departing from the scope and spirit of the invention.

FIG. 13 is an alternative embodiment of the invention illustrated by an exemplary integrated mass storage device 120. The integrated mass storage device 120 includes three substrates: a substrate 10, a rotor substrate 106, and a stator substrate 108. The rotor substrate 106 has at least one media surface 102 on a portion of the substrate that is able to move in preferably a first and second direction using electrostatic circuits 104, preferably in a step motor type function. The movable media surface 102 is supported by springs 114, preferably formed by etching the rotor substrate. Those skilled in the art are aware of several different micro-mechanical system (MEMs) architectures for fabricating the movable media surface 102.

Electrical contact between the stator substrate 108 and the rotor substrate 106 is performed by contacts 118. Preferably, a bonding seal 116 attaches the rotor substrate 106 to the stator substrate 108 and preferably seals the interior to keep an evacuated environment within the integrated mass storage device 120. Also rotor substrate 106 is attached to substrate 10 using a spacer 124 that is also preferably an airtight seal. Optionally, an alternative seal 122 can be used instead of or in conjunction with spacer 124 to adhere and/or seal substrate 10 to rotor substrate 106.

Figure 14:
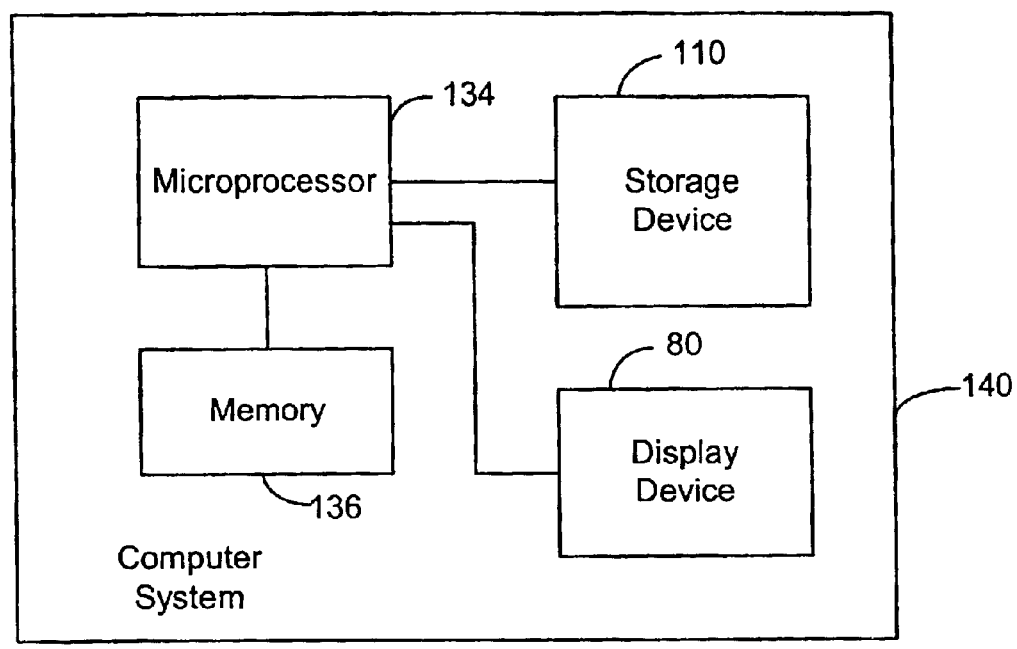
FIG. 14 is an embodiment of the invention incorporated into an electronic device.

Substrate 10 includes a stack of thin-film layers 88 that are preferably applied using conventional semiconductor equipment. The stack of thin-film layers 88 include a set of integrated emitters 100 incorporating the invention that are focused using an electronic lens 28 that creates an electric field 34 that creates the focused beam 32 on the media surface 102 to a spot size of preferably less than 40 nanometers and more preferably less than 10 nanometers. The electronic lens 28 preferably has a lens opening of about 7.2 micrometers. Preferably the space between the substrate 10 and the rotor substrate 106 is evacuated of air to preferably less the $10^{-3}$ Torr to prevent the electrons emitted from the integrated emitters 100 from colliding with gas or other particles which could damage the integrated emitters 100. The integrated emitters 100 are held at a first voltage potential to create the electrons preferably by tunneling techniques. The first voltage potential is preferably less than about 25 volts. The electronic lens 28 is held at a second voltage potential, preferably about 0 volts with respect to ground to create the electric field 34 used for focusing the electrons. The media surface 102 is preferably held to a third potential preferably greater than 500 volts, for example about 700 volts, to attract the electrons emitted from the integrated emitters 100. Preferably, the electronic lens 28 is separated from the integrated emitters 100 by a first distance, for example about 5 micrometers FIG. 14 is an exemplary block diagram of an electronic device 140, such as a computer system, video game, Internet appliance, terminal, MP3 player, or personal data assistant to name just a few. The electronic device 140 includes a microprocessor 134, such as an Intel Pentium Processor™ or compatible processor although other processors exist and are known to those skilled in the art. The microprocessor 134 is connected to a memory device 136 that includes computer readable memory that is capable of holding computer executable commands used by the microprocessor 134 to control data and/or input/output functions. Memory 136 can also store data that is manipulated by the microprocessor 134. The microprocessor 134 is also connected to either a storage device 110 or display device 80 or both. The storage device 110 and the display device 80 contain an embodiment of the invention as exemplified in earlier described figures and text showing field emission devices.

Figure 15:
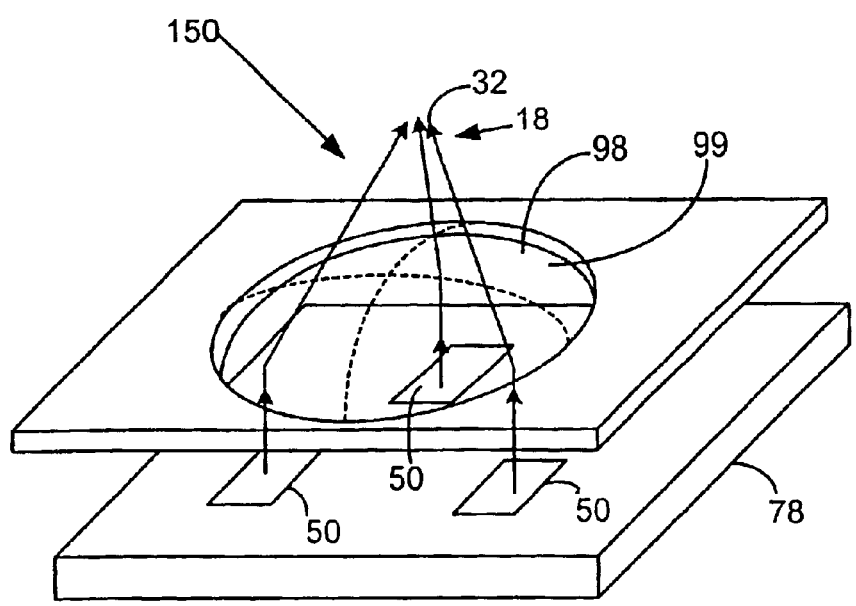
FIG. 15 is an embodiment of the invention incorporated into an optical display device.

FIG. 15 is an alternative embodiment of the invention illustrating an optical display device 150 that uses an emitter array 78 of either emitters 50 or optionally integrated emitters 100 to form an image that is focused using an optical lens 98 to create a focused beam 32. The emitters 50 create photons 18 and also electrons 16 (not shown). A transparent conductor 99 such as indium tin oxide on the side of the optical lens 98 that faces the emitters 50 captures the electrons. One purpose of the transparent conductor 99 is to allow the photons 18 to pass through while preventing the electrons emitted from gathering on the lens and creating a high electrostatic field.

While the present invention has been particularly shown and described with reference to the foregoing preferred and alternative embodiments, those skilled in the art will understand that many variations may be made therein without departing from the spirit and scope of the invention as defined in the following claims. This description of the invention should be understood to include all novel and non-obvious combinations of elements described herein, and claims may be presented in this or a later application to any novel and non-obvious combination of these elements. The foregoing embodiments are illustrative, and no single feature or element is essential to all possible combinations that may be claimed in this or a later application. Where the claims recite "a" or "a first" element of the equivalent thereof, such claims should be understood to include incorporation of one or more such elements, neither requiring nor excluding two or more such elements.

What is claimed is:

1. An emitter, comprising:

an electron supply;

a tunneling layer disposed on the electron supply;

a cathode layer disposed on the tunneling layer; and a conductive electrode having multiple layers of conductive material including a protective layer disposed on the cathode layer and wherein the conductive electrode has been etched to define an opening thereby exposing a portion of the cathode layer.

2. The emitter of claim 1 wherein the protective layer is titanium or molybdenum.

3. The emitter of claim 1 wherein the protective layer has a thickness about 300 to about 1500 Angstroms.

4. The emitter of claim 1 wherein the cathode layer includes gold, tantalum, platinum, or combinations thereof.

5. The emitter of claim 1, further comprising;

an electron lens for focusing electrons emitted from the exposed portion of the cathode layer.

6. The emitter of claim 1, wherein the protective layer is a first protective layer and the conductive electrode is a first conductive electrode, the emitter further comprising:
a second protective layer disposed on the first conductive electrode and defining an opening in substantial alignment with the opening of the first conductive electrode;
a spacer layer disposed on the second protective layer and defining an opening in substantial alignment with the opening of the first conductive electrode; and
a second conductive electrode disposed on the spacer layer and defining an opening in substantial alignment with the opening of the conductive electrode.

7. An integrated circuit, comprising:
a substrate;
at least one emitter of claim 1 disposed on the substrate; and
circuitry formed on the substrate with the emitter for operating the at least one emitter.

8. An electronic device, comprising:
the emitter of claim 1 for emitting energy; and
an anode structure for receiving the emitted energy and generating at least a first effect in response to receiving the emitted energy and a second effect in response to not receiving the emitted energy.

9. The electronic device of claim 8 wherein the electronic device is a mass storage device and the anode structure is a storage medium, the electronic device further comprising a reading circuit for detecting the effect generated on the anode structure.

10. The electronic device of claim 8 wherein the electronic device is a display device and the anode structure is a display screen that creates a visible effect in response to receiving the emitted energy.

11. The electronic device of claim 10 wherein the display screen includes one or more phosphors operable for emitting photons in response to receiving the emitted energy.

12. An emitter, comprising:
a cathode layer having an emissive surface;
an electron lens disposed at a predetermined distance from the emissive surface;
a spacer layer of tetraethylorthosilicate, silicon oxides, silicon nitrides, or combinations thereof separating the electron lens and emissive surface; and
at least one sacrificial layer disposed between the cathode layer and the electron lens, the at least one sacrificial layer having an opening substantially aligned with said emissive surface.

13. The emitter of claim 12 wherein the at least one sacrificial layer is titanium or molybdenum.

14. An emitter, comprising:
an electron supply;
a tunneling layer formed on the electron supply;
a cathode layer formed on the tunneling layer; and
a conductive protective layer disposed on the cathode layer wherein the conductive protective layer has been etched to define an opening thereby exposing a portion of the cathode layer for electron emission.

15. The emitter of claim 14 capable of emitting photons in addition to the electron emission.

16. A display device using the emitter of claim 14 to form a portion of an image from the emitted photons.

17. The emitter of claim 14 wherein the conductive protective layer has been etched with sulfuric peroxide.

18. The emitter of claim 14 further comprising a lens structure formed on the conductive protective layer before the conductive protective layer is etched.

19. The emitter of claim 18 wherein the lens structure comprises a spacer layer formed of tetraethylorthosilicate, silicon oxides, silicon nitrides, or combinations thereof.

20. A display device, comprising:
an integrated circuit including the emitter of claim 14, the emitter creates a visible light source; and
a lens for focusing the visible light source, wherein the lens is coated with a transparent conducting surface to capture electrons emitted from the emitter.

21. A storage device, comprising:
an integrated circuit including the emitter of claim 14, the emitter creates a focused electron beam; and
a storage medium in close proximity to the emitter, the storage medium having a storage area being in one of a plurality of states to represent the information stored in that storage area;
such that:
an effect is generated when the focused electron beam strikes the storage area;
the magnitude of the effect depends on the state of the storage area; and
the information stored in the storage area is read by measuring the magnitude of the effect.

22. An electronic device, comprising:
an integrated circuit including the emitter of claim 14; and
a focusing device for converging the emissions from the emitter.

23. A computer system, comprising:
a microprocessor;
the electronic device of claim 22 coupled to the microprocessor; and
memory coupled to the microprocessor, the microprocessor operable of executing instructions from the memory to transfer data between the memory and the electronic device.

24. The computer system of claim 23 wherein the electronic device is a storage device.

25. The computer system of claim 23 wherein the electronic device is a display device.

26. An emitter, comprising:
a substrate;
an insulator layer formed on the substrate and having a first opening defined within;
an emission layer disposed over the insulator layer and first opening and contacting the substrate;
a tunneling layer formed on the emission layer;
a cathode layer disposed on the tunneling layer wherein a portion of the cathode layer on the tunneling layer is an electron-emitting surface; and
a conductive protective layer disposed on the cathode layer and defining a second opening substantially aligned with the first opening.

27. The emitter of claim 26 wherein the electron emitting surface has an emission rate of about 0.1 to about 8.0 Amps per square centimeter.

28. The emitter of claim 26 wherein the protective layer is formed of titanium or molybdenum.

29. The emitter of claim 26 wherein the emission layer is formed of polysilicon.

30. The emitter of claim 26 further comprising an electron lens disposed a first distance from the electron-emitting surface.

31. The emitter of claim 30 further comprising a spacer layer of tetraethylorthosilicate, silicon oxides, silicon nitrides, or combinations thereof disposed between the electron lens and the protective layer.

32. The emitter of claim 31 wherein the stress created between the spacer layer and the cathode layer is less than an absolute value of about 100 mPascals.

33. The emitter of claim 31 wherein the spacer layer etch rate and the protective layer etch rate have an etch selectivity at least about 10:1.

34. The emitter of claim 26 wherein the protective layer has been etched with sulfuric peroxide or ammonia and water to create the defined opening within the protective layer.

35. The emitter of claim 34 wherein the sulfuric peroxide etch is performed using about 1 part $H_2O$ and about 2 parts $H_2SO_4$.

36. An integrated circuit comprising at least one emitter of claim 26.

37. A display device comprising at least one emitter of claim 26.

38. A storage device comprising at least one emitter of claim 26.

39. An electronic device comprising at least one emitter of claim 26.

40. An integrated circuit, comprising:
a substrate;
at least one emitter formed on the substrate including,
an insulator layer having at least one opening to define the location and shape of the at least one flat emitter device,
an emission layer disposed within the at least one opening of the insulator layer and further disposed over the insulator layer;
a tunneling layer disposed over the emission layer;
a cathode layer disposed over the tunneling dielectric; and
a protective layer disposed over cathode layer, the protective layer having at least one opening in substantial alignment with the at least one opening of the insulator layer.

41. The integrated circuit of claim 40 wherein the protective layer is comprised of titanium or molybdenum of about 300 to about 1500 Angstroms in thickness.

42. The integrated circuit of claim 41 the emission layer is formed of polysilicon.

43. The integrated circuit of claim 42 wherein the tunneling layer is comprised of thermal oxide grown from polysilicon layer.

44. The integrated circuit of claim 41 further comprising an electron lens disposed on the at least one emitter.

* * * * *

UNITED STATES PATENT AND TRADEMARK OFFICE
CERTIFICATE OF CORRECTION

PATENT NO. : 6,933,517 B2
DATED : August 23, 2005
INVENTOR(S) : Chen et al.

It is certified that error appears in the above-identified patent and that said Letters Patent is hereby corrected as shown below:

Column 14,
Line 5, delete "claim 14, the" and insert -- claim 14, wherein the --.

Signed and Sealed this

Tenth Day of January, 2006

JON W. DUDAS
*Director of the United States Patent and Trademark Office*